United States Patent [19]

Sweatt

[11] Patent Number: 5,512,759
[45] Date of Patent: Apr. 30, 1996

[54] CONDENSER FOR ILLUMINATING A RINGFIELD CAMERA WITH SYNCHROTRON EMISSION LIGHT

[76] Inventor: William C. Sweatt, 13027 Arroyo de Vista, Albuquerque, N.M. 87111

[21] Appl. No.: 469,590

[22] Filed: Jun. 6, 1995

[51] Int. Cl.[6] .................................................. G21K 1/06
[52] U.S. Cl. .......................................... 250/492.1; 378/34
[58] Field of Search .......................... 250/492.1, 492.2; 378/34, 35, 85, 87, 145

[56] References Cited

U.S. PATENT DOCUMENTS

| | | | |
|---|---|---|---|
| 3,748,015 | 7/1973 | Offner | 350/55 |
| 5,315,629 | 5/1994 | Jewell et al. | 378/34 |
| 5,339,346 | 8/1994 | White | 378/34 |
| 5,361,292 | 11/1994 | Sweatt | 378/34 |
| 5,371,774 | 12/1994 | Cerrina et al. | 378/34 |
| 5,439,781 | 8/1995 | MacDowell et al. | 250/492.1 |

*Primary Examiner*—Bruce C. Anderson
*Assistant Examiner*—Kiet T. Nguyen
*Attorney, Agent, or Firm*—Andrew A. Abeyta

[57] ABSTRACT

The present invention relates generally to the field of condensers for collecting light from a synchrotron radiation source and directing the light into a ringfield of a lithography camera. The present invention discloses a condenser comprising collecting, processing, and imaging optics. The collecting optics are comprised of concave and convex spherical mirrors that collect the light beams. The processing optics, which receive the light beams, are comprised of flat mirrors that converge and direct the light beams into a real entrance pupil of the camera in a symmetrical pattern. In the real entrance pupil are located flat mirrors, common to the beams emitted from the preceding mirrors, for generating substantially parallel light beams and for directing the beams toward the ringfield of a camera. Finally, the imaging optics are comprised of a spherical mirror, also common to the beams emitted from the preceding mirrors, images the real entrance pupil through the resistive mask and into the virtual entrance pupil of the camera. Thus, the condenser is comprised of a plurality of beams with four mirrors corresponding to a single beam plus two common mirrors.

17 Claims, 6 Drawing Sheets

5,512,759

CONDENSER FOR ILLUMINATING A RINGFIELD CAMERA WITH SYNCHROTRON EMISSION LIGHT

I. GOVERNMENT RIGHTS

This invention was made with United States Government support under Contract No. DE-AC04-76DP00789 awarded by the U.S. Department of Energy. The Government has certain rights in this invention.

II. BACKGROUND OF THE INVENTION

A. Field of the Invention

The present invention relates in general to the field of condensers (a.k.a., illuminators) for collecting and condensing light and directing the light into a projection camera designed for projection lithography. More specifically, the present invention relates to condensers that collect and condense synchrotron emission light from a synchrotron radiation source using a plurality of mirrors and couple the light to the ringfield of a camera operating in a ringfield scanning mode.

B. Discussion of Related Art

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft" x-rays (wavelength range of $\lambda=100$ to 200 Å ("Angstrom")) are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that most x-ray reflectors have efficiencies of only about 60%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then use the ringfield to scan a reflective mask and translate the image onto a wafer for processing. Although cameras have been designed for ringfield scanning (e.g., Jewell et al., U.S. Pat. No. 5,315,629 and Offner, U.S. Pat. No. 3,748,015), available condensers that can efficiently couple the light from a synchrotron source to the ringfield required by this type of camera have not been fully explored. Furthermore, full field imaging, as opposed to ringfield imaging, requires severely aspheric mirrors. Such mirrors cannot be manufactured to the necessary tolerances with present technology for use at the required wavelengths.

The present state-of-the-art for Very Large Scale Integration ("VLSF") is a 16 megabit chip with circuitry built to design rules of 0.5 μm. Effort directed to further miniaturization takes the initial form of more fully utilizing the resolution capability of presently-used ultraviolet ("UV") delineating radiation. "Deep UV" (wavelength range of $\lambda=0.3$ μm to 0.1 μm), with techniques such as phase masking, off-axis illumination, and step-and-repeat may permit design rules (minimum feature or space dimension) of 0.25 μm or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths.

Two x-ray radiation sources are under consideration. One source, a plasma x-ray source, depends upon a high power, pulsed laser (e.g., a yttrium aluminum garnet ("YAG") laser), or an excimer laser, delivering 500 to 1,000 watts of power to a 50 μm to 250 μm spot, thereby heating a source material to, for example, 250,000° C., to emit x-ray radiation from the resulting plasma. Plasma sources are compact, and may be dedicated to a single production line (so that malfunction does not close down the entire plant). Another source, the electron storage ring synchrotron, has been used for many years and is at an advanced stage of development. Synchrotrons are particularly promising sources of x-rays for lithography because they provide very stable and defined sources of x-rays.

Electrons, accelerated to relativistic velocity, follow their magnetic-field-constrained orbit inside a vacuum enclosure of the synchrotron and emit electromagnetic radiation as they are bent by a magnetic field used to define their path of travel. Radiation, in the wavelength range of consequence for lithography, is reliably produced. The synchrotron produces precisely defined radiation to meet the demands of extremely sophisticated experimentation. The electromagnetic radiation emitted by the electrons is an unavoidable consequence of changing the direction of travel of the electrons and is typically referred to as synchrotron radiation. Synchrotron radiation is comprised of electromagnetic waves of very strong directivity emitted when electron or positron particles, which are emitted from a synchrotron source, travel at velocities approximate to the velocity of light and are deflected from their orbits by a magnetic field.

Synchrotron radiation is emitted in a continuous spectrum or fan of "light", referred to as synchrotron emission light, ranging from radio and infrared wavelengths upwards through the spectrum, without the intense, narrow peaks associated with other sources. Synchrotron emission light has characteristics such that the beam intensity is high, the linearity is strong, and the divergence is small so that it becomes possible to accurately and deeply sensitize a photolithographic mask pattern into a thickly applied resist. Generally, all synchrotrons have spectral curves similar to the shape shown in FIG. 1 of Cerrina et al. (U.S. Pat. No. 5,371,774) that define their spectra, which vary from one another in intensity and the critical photon energy.

Parameters describing the size of the source of synchrotron radiation and the rate at which it is diverging from the source are of importance. Because the electrons are the source of synchrotron radiation, the cross section of the electron beam defines the cross section of the source. Within the plane of the orbit, the light is emitted in a broad, continuous fan, which is tangent to the path of the electrons, as illustrated in FIG. 1. FIG. 1 shows a section of a synchrotron having an orbiting electron beam (10) and a fan of synchrotron radiation indicated by the arrow (12).

Because of the relatively small height and width of the electron beam, any point along its length acts as a point source of radiation, providing crisp images at an exposure plane which is typically 8 meters or more away from the ring. At a distance of 8 meters, however, a 1 inch wide exposure field typically collects only 3.2 milli-radians ("mrad") of the available radiation. There are two ways to improve the power incident at a photo-resist: either shorten the beamline or install focusing elements. The use of focusing elements has the potential advantage of collecting x-rays from a very wide aperture and providing a wide image with a very small vertical height. However, the use of focusing elements results in a loss of power at each element because of low reflectivity of the x-rays and introduces aberrations. Synchrotron radiation is emitted in a horizontal fan. The small vertical divergence of the synchrotron radiation implies that a wide horizontal mirror, or a plurality of smaller parallel systems, can accept a large fan of light, whose outputs are added together at the mask plane.

A variety of x-ray patterning approaches are under study. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing from the wafer (i.e., out of contact with the wafer, thus, the term "proximity"), which lessens the likelihood of mask damage but does not eliminate it. Making perfect masks on a fragile membrane continues to be a major problem. Necessary absence of optics in-between the mask and the wafer necessitates a high level of parallelicity in the incident radiation. X-ray radiation of wavelength $\lambda \leq 16$ Å is required for 0.25 µm or smaller patterning to limit diffraction at feature edges on the mask.

Use has been made of the synchrotron source in proximity printing. (Consistent with traditional, highly demanding, scientific usage, proximity printing has been based on the usual small collection arc. Relatively small power resulting from the 10 mrad to 20 mrad arc of collection, together with the high-aspect ratio of the synchrotron emission light, has led to use of a scanning high-aspect ratio illumination field (rather than the use of a full-field imaging field).

Projection lithography has natural advantages over proximity printing. One advantage is that the likelihood of mask damage is reduced, which reduces the cost of the now larger-feature mask. Imaging or camera optics in-between the mask and the wafer compensate for edge scattering and, so, permit use of longer wavelength radiation. Use of extreme ultra-violet radiation (a.k.a., soft x-rays) increases the permitted angle of incidence for glancing-angle optics. The resulting system is known as extreme UV ("EUVL") lithography (a.k.a., soft x-ray projection lithography ("SXPL")).

A favored form of EUVL is ringfield scanning. All ringfield optical forms are based on radial dependence of aberration and use the technique of balancing low order aberrations, i.e., third order aberrations, with higher order aberrations to create long, narrow illumination fields or annular regions of correction away from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width is a function of the smallest feature to be printed with increasing residual astigmatism at distances greater or smaller than the design radius being of greater consequence for greater resolution. Use of such an arcuate field avoids radially-dependent image aberrations in the image. Use of object:image size reduction of, for example, 5:1 reduction, results in significant cost reduction of the, now, enlarged-feature mask.

It is expected that effort toward adaptation of electron storage ring synchrotron sources for EUVL will continue. Economical high-throughput fabrication of 0.25 µm or smaller design-rule devices is made possible by use of synchrotron-derived x-ray delineating radiation. Large angle collection over at least 100 mrad will be important for device fabrication. Design of collection and processing optics design of the condenser is complicated by the severe mismatch between the synchrotron light emission pattern and that of the ringfield scan line.

The present invention discloses a condenser for collecting and processing illumination from a synchrotron source and directing the illumination into a ringfield camera designed for photolithography. The condenser employs a relatively simple and inexpensive design, which utilizes spherical and flat mirrors that are easily manufactured. The condenser employs a plurality of optical mirrors and lenses, which form collecting, processing, and imaging optics to accomplish this objective.

III. SUMMARY OF THE INVENTION

The principal object of the present invention is to permit very high quality illumination of a narrow ringfield of a lithography camera using synchrotron radiation as the source.

It is also an object of the present invention to ensure that the ringfield of a lithography camera is illuminated with a synchrotron source that has uniform, intensity and partial coherence properties along the ring.

It is another object of the present invention to ensure that the ringfield of a lithography camera is illuminated with a synchrotron source that has uniform, partial coherence properties in all orientations (angles measured in the r-Θ plane).

It is still another object of the present invention to collect over at least 100 mrad to a full radian, or greater, of synchrotron emission light and efficiently illuminate the ringfield of a lithography camera.

It is yet another object of the present invention to ensure that the condenser has a very small Etendú or Lagrange Optical Invariant.

Additional objects, advantages, and novel features will become apparent to those of ordinary skill in the art upon examination of the following detailed description of the invention or may be learned by practice of the present invention. The objects and advantages of the present invention may be realized and attained by means of the instrumentalities and combinations particularly pointed out in the appended claims.

Accordingly, the present invention accomplishes the foregoing objects by providing a condenser system to collect and condense large amounts of synchrotron emission light emitted from a synchrotron radiation source, direct it into the ringfield of a camera designed for photolithography, which delivers it to a mask. The light beams emitted from the condenser system produce arc-shaped light beams that correspond directly with the arc-shaped ringfield of the camera, thus providing a high quality, uniformly illuminated image. Because the synchrotron emission light takes the shape of a fan with several legs, the present invention positions sets of collecting and processing optics on each leg of the fan, and positions imaging optics on the respective legs of the fan that are common to the collecting and processing optics. The condenser system comprises a collecting means, positioned about the periphery of a synchrotron source, for collecting a plurality of synchrotron light beams emitted from the fan of synchrotron emission light and for transforming the plurality of synchrotron light beams into a plurality of arc-shaped light beams, each one of the plurality of arc-shaped light beams having an arc-shaped cross-section; processing means, succeeding the collecting means, for rotating and directing the plurality of arc-shaped light beams toward the plane (hereinafter referred to as the real entrance pupil, which is an image of the actual pupil in the camera), of a camera and for positioning a plurality of substantially parallel arc-shaped light beams at the real entrance pupil of the camera; and imaging means, succeeding the processing means, for converging the substantially parallel arc-shaped light beams, for transmitting the plurality of the substantially parallel arc-shaped light beams through a resistive mask and into the virtual entrance pupil of the camera, and for illuminating the ringfield of the camera.

The collecting, processing, and imaging optics combine to produce an image quality to adequately illuminate any ringfield with a width of $W \geq 100$ μm. The collecting optics comprise a plurality of spherical mirrors, each plurality of spherical mirrors comprising a concave mirror and a convex mirror, for collecting and converting the light beams into arc-shaped light beams. In an alternative embodiment, the first mirror may be convex, and the second mirror may be concave. The processing optics comprise a plurality of flat mirrors, each one of the flat mirrors being common to a respective pair of the spherical mirrors, for rotating and directing the arc-shaped light beams into a real entrance pupil of the camera in a symmetrical, circular pattern where flat mirrors are positioned to direct the beams towards the ringfield of a camera. The light beams collected at the real entrance pupil are imaged into a virtual entrance pupil of the camera by the use of imaging optics. The condenser system provides uniform coherence properties for features on the mask oriented at any angle.

Further scope of applicability of the present invention will become apparent from the detailed description of the invention provided hereinafter. It should be understood, however, that the detailed description of the invention and the specific examples presented, while indicating preferred embodiments of the present invention, are provided for illustration purposes only because various changes and modifications within the spirit and scope of the present invention will become apparent to those of ordinary skill in the art from the detailed description of the invention that follows.

IV. BRIEF DESCRIPTION OF THE DRAWINGS

The accompanying figures, which are incorporated in and form part of the specification, further illustrate the present invention and, together with the detailed description of the invention, serve to explain the principles of the present invention.

V. DETAILED DESCRIPTION OF THE INVENTION

Figure 1:
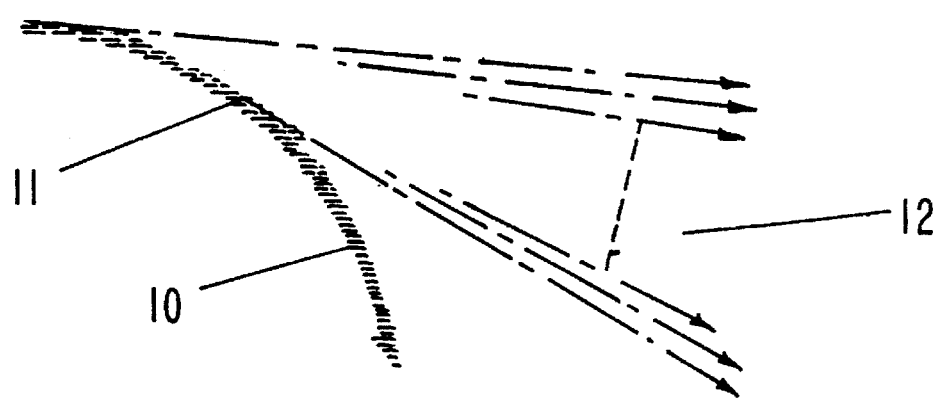
FIG. 1 is a diagram of an electron beam, following its curved synchrotron orbit and emitting a fan of synchrotron radiation.

The following terms of art are defined before providing a description and discussion of the present invention.

A. Terms of Art

Synchrotron Source: X-ray radiation source for accelerating electrons or protons in closed orbits in which the frequency of the accelerating voltage is varied (or held constant in the case of electrons) and the strength of the magnetic field is varied so as to keep the orbit radius constant.

Synchrotron Radiation: The delineating electromagnetic radiation generated by the acceleration of charged relativistic particles, usually electrons, in a magnetic field as incident on and producing an illumination field on a mask. The illumination field is characterized by its intensity, direction, divergence, and spectral width.

EUV: Extreme Ultra-Violet Radiation, also known as soft x-rays, with wavelength in the range of 50 to 700 Å.

1× Camera: A camera of the class disclosed in U.S. Pat. No. 3,748,015.

5× Camera: A camera of the class disclosed in U.S. Pat. No. 5,315,629.

Spherical Mirror (Powered Mirror): A mirror, either concave or convex, whose surface forms part of a sphere. Although the present invention employs the use of spherical mirrors for convenience and economical concerns, it is intended that other mirrors be covered by the present invention, such as toroidal, conic sections (e.g., parabolic, hyperbolic, elliptical, etc.), mirrors that may be substituted for spherical mirrors within tolerable industry standards (including those with minor flaws or aberrations), etc.

Flat Mirror: A mirror whose surface is nearly flat within manufacturing tolerances. Although the present invention employs the use of flat mirrors, it is intended that the present invention be easily modified by those of ordinary skill in the art to employ the use of spherical mirrors where flat mirrors are disclosed in the following discussion.

Divergence: As used by itself, the term refers to mask divergence, i.e., the largest angle about the axis of the cone of radiation as incident on a mask. In projection lithography, the axis is generally a few degrees off normal incidence as required for reflection masking. The magnitude of divergence required in projection lithography is that needed to reduce ringing at feature edges to the extent necessary for desired resolution and contrast. In full-field exposure mode, divergence should be similar at every illumination point. In scanning mode, some nonuniformity in the scanning direction may be averaged out.

Convergence: As used by itself, the term refers to mask convergence, i.e., the smallest angle about the axis of the cone of radiation as incident on a mask.

Condenser: Optical system for collecting the synchrotron radiation, for processing the synchrotron radiation to produce a ringfield illumination field and for illuminating the mask.

Collecting Optics (or Collector): The optics within the condenser responsible for collecting the synchrotron radiation. The collector has a focus.

Processing Optics: The optics within the condenser, in addition to the collecting optics, responsible for processing collected radiation for delivery to the mask.

Imaging Optics (or Camera Optics): The optics following the condenser, in addition to the collecting and processing optics, responsible for delivering mask-modulated radiation to the wafer, i.e., the camera optics.

Camera Pupil: Real or virtual aperture that defines the position through which synchrotron radiation must enter the camera, of angular size defining the diffraction limit of the camera. Its physical size is that of an image of the real limiting aperture of the camera.

Aperture Stop: The point at which the principal rays cross; the stop serves to fold the ray bundles, i.e., to move the image to the other side of the optics.

Lens: The term is used in this description to define any optical element which causes x-ray radiation to converge or diverge. "Lenses," in x-ray systems, are generally reflecting and are sometimes referred to as "mirrors." Contemplated lenses may be multi-faceted or may be non-faceted, i.e., continuous, e.g., of ellipsoidal or other curvature. The convergence or divergence is a result of action analogous to that of a transmission optical lens.

Full-field Exposure: Simultaneous (rather than sequential) exposure of all subareas of an image field. In its derivation, the term refers generally to a complete circuit pattern such as that of an entire chip. In this description, it is used to refer to any low-aspect ratio rectilinear pattern region, whether of an entire or partial pattern. Contemplated partial patterns may be stitched together by step-and-repeat to constitute the entire pattern.

B. The Invention

The present invention makes effective use of x-ray synchrotron radiation, collected over a large emission arc for use in illuminating a pattern mask. The arc is at least 100 mrad, or preferably 200 mrad, to a full radian or more. Pattern delineation to which the radiation is to be applied may take a variety of forms. It may take the form of full-field exposure or of a scanning (e.g., ringfield) region. Exposure may be by proximity printing or by projection lithography. A favored form of projection lithography, known as ringfield projection lithography, makes use of a scanning region of arcuate shape, likely with object:image size reduction, perhaps by a ratio of 5:1, to permit use of more economical, larger-feature masks.

Synchrotron radiation is not well adapted to satisfy either ringfield scanning or full-field exposure needs. Synchrotron radiation is shown in FIG. 1. As the high speed electrons within beam (10) follow a curved path (11), they emit a fan shape of electromagnetic radiation (12) in a horizontal plane, also referred to as synchrotron emission light. The photon energy is determined by the electron energy and by the curvature of the electron path. Electron energies of $5 \times 10^8$ to $1 \times 10^9$ are useful for x-ray radiation at the 5 to 150 Å wavelength range of interest (for synchrotron devices in present use). The emitted radiation fan is very thin, perhaps 1 mm thick, spreading to a thickness of a few millimeters at a distance of several meters from the synchrotron source. The angle of the emission fan is the same as that of the bent emitting path.

Because synchrotron radiation has a high degree of coherence, it is possible to capture all the radiation emitted, with any losses coming only from the finite reflectivity of the mirrors employed in the condenser design.

C. The Condenser

Figure 3:
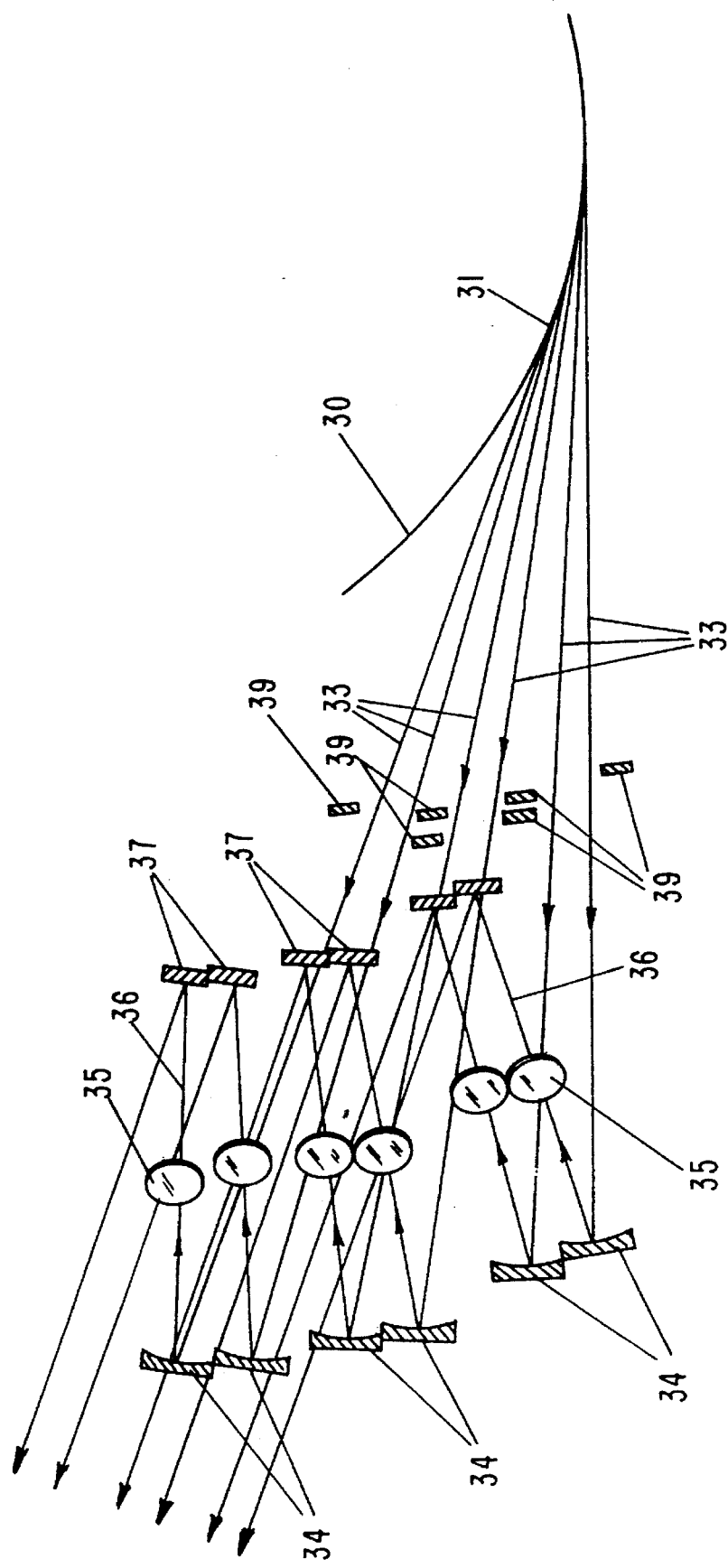
FIG. 3 is a top view of the optics of the condenser of the present invention nearest the synchrotron source radiation.
Figure 5:
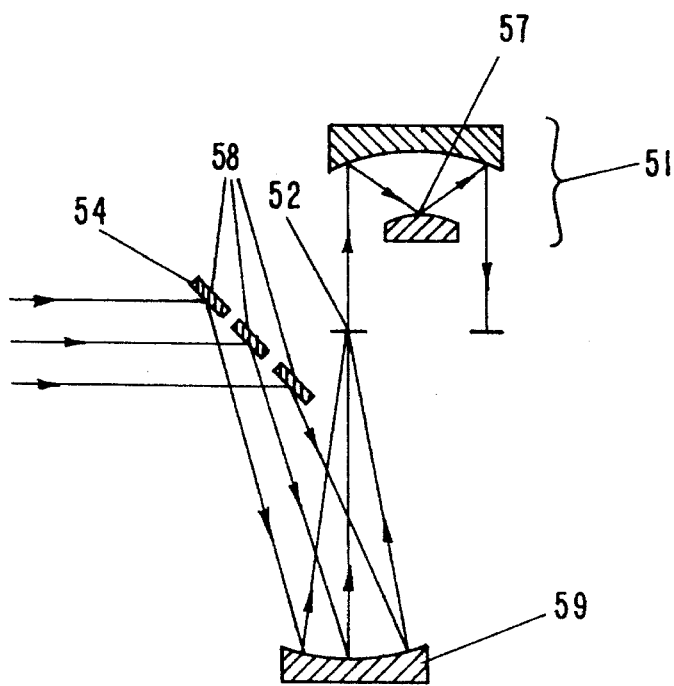
FIG. 5 is a side view of the optics of the condenser nearest the ringfield camera.

The condenser of the present invention provides for collection of a large arc of the synchrotron radiation by use of a plurality of spherical mirrors arranged in a series (Six beams of synchrotron light and six beams of light and six sets of mirrors are shown in FIGS. 3 and 5 for convenience in introducing the invention. The figures will be discussed infra with respect to the reference numerals.) to collect the synchrotron light, and a plurality of flat mirrors follow the spherical mirrors to process the synchrotron light. Following the flat mirrors are optics comprising flat mirrors located in the same plane as the real entrance pupil of the camera and directs the beams toward the ringfield of the camera. Following the flat mirrors is a spherical mirror that projects the image formed at the real entrance pupil through the resistive mask and into the virtual entrance pupil of the camera. The condenser optics are located intermediate to the synchrotron source and the ringfield camera.

For convenience in introducing the invention, the following discussion is generally in terms of the single elements that collect and process a single beam of synchrotron light. Even though depicted as single elements, however, two or more elements may be combined for a given change in beam direction. Also, any number of beams may be collected depending on the power to be collected from the synchrotron source, which would require a corresponding set of (six) mirrors for each beam to be collected, processed, and imaged.

In a preferred embodiment, the condenser system comprises, from synchrotron source plane to image (the wafer) plane, at least two spherical mirrors for collecting and shaping a single light beam, wherein the spherical mirrors comprises a first mirror that is concave and a second mirror that is convex. The first and second spherical mirrors are tilted for collecting and transforming the light beam into an arc-shaped light beam. The resulting arc-shaped light beam fits the ringfield of the camera. A third mirror, following the second mirror and shown in FIG. 4 (discussed in detail infra), is a flat mirror for rotating and directing the light into a real entrance pupil of a ringfield camera. A fourth mirror, following the third mirror, is a flat mirror also for rotating and directing the light into a real entrance pupil of a ringfield camera. A fifth mirror, following the fourth mirror, is a flat mirror. It is located at the real entrance pupil of the camera and is individually tilted to make all the light beams substantially parallel to each other when more than one beam is collected. The fifth mirror directs the beam(s) toward the ringfield of a camera. A sixth mirror, following the fifth mirror, is common to all of the beam(s) emitted from the preceding mirror sets and is a spherical mirror. The sixth mirror images the beams located at the real entrance pupil through the resistive mask and into the virtual entrance pupil of the camera. The sixth mirror also serves to converge the six beams at the mask plane. Thus, the condenser is comprised of a plurality of beams with five mirrors corresponding to a single beam plus one mirror that is common to the plurality of beams.

Figure 8:
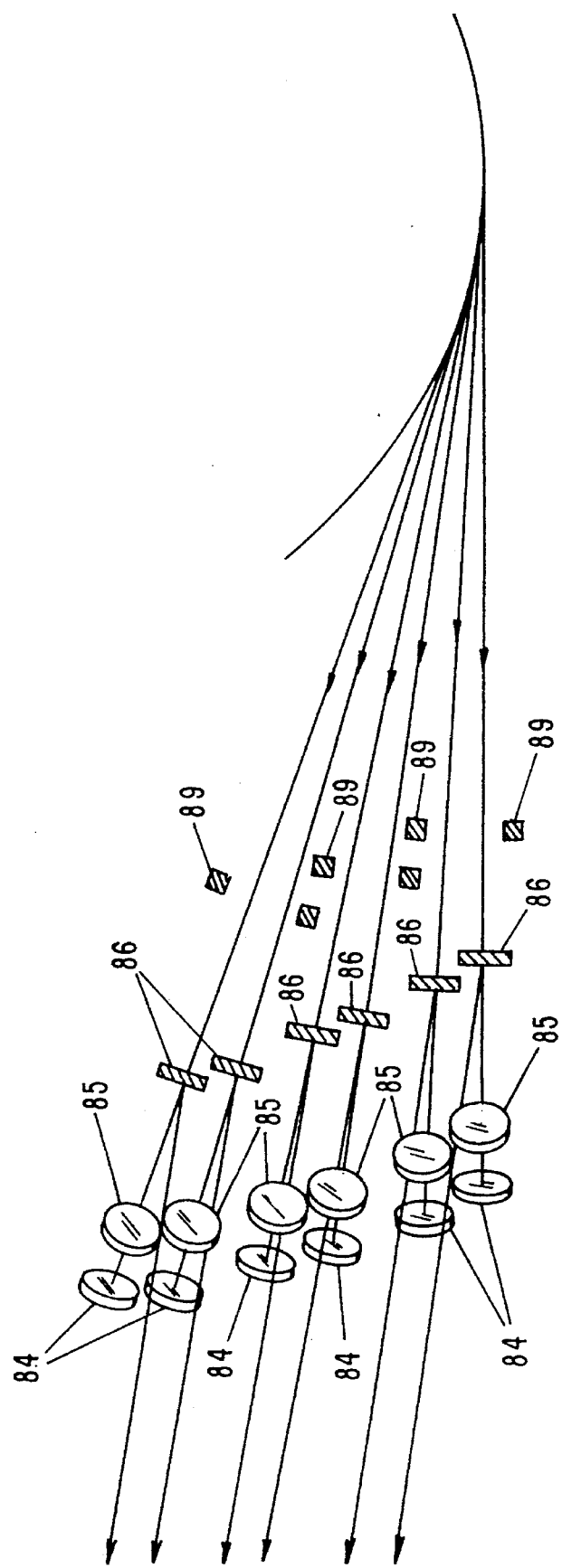
FIG. 8 is a top view of an alternate embodiment of the present invention showing the optics of the condenser nearest the synchrotron source radiation.
Figure 9:
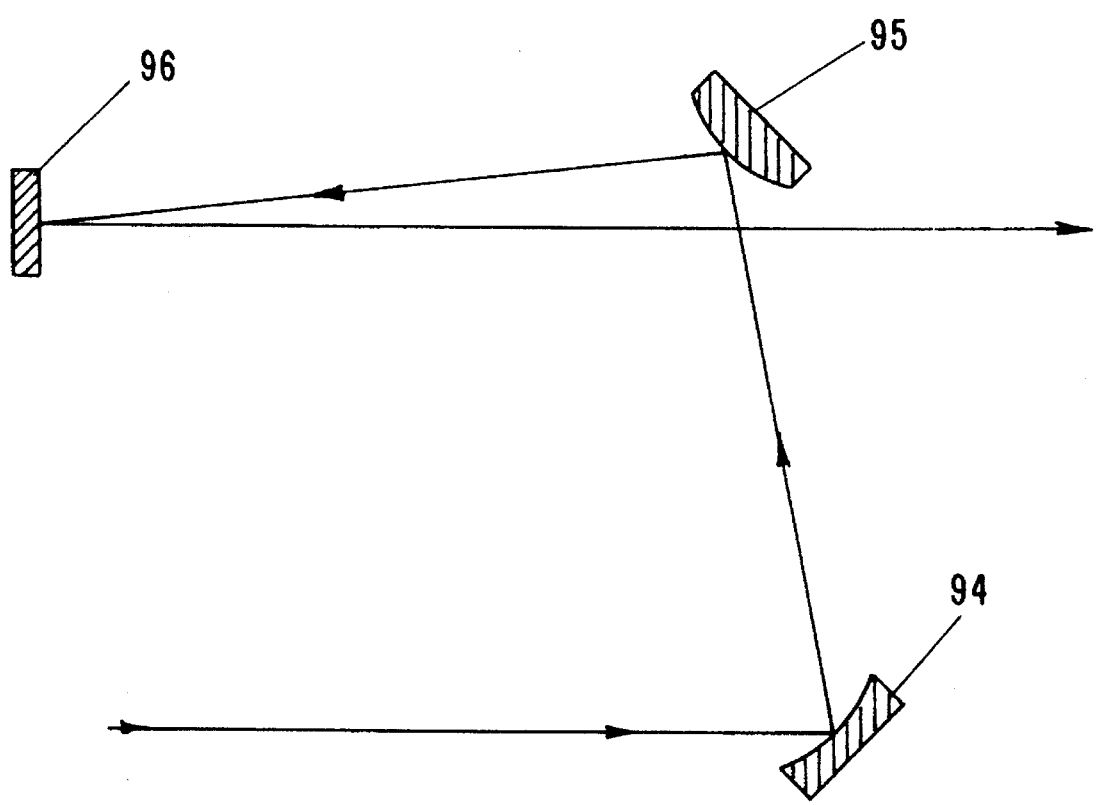
FIG. 9 is a side view of the alternate embodiment showing the first three mirrors of the condenser nearest the synchrotron radiation source.

In an alternate embodiment, the third and fourth mirrors could be combined to use only one flat mirror, provided the first and second mirror are positioned accordingly as shown in FIGS. 8 and 9. The design and function of this alternate embodiment is equivalent to the design and function of the preferred embodiment discussed supra with the exception of the use of fewer processing mirrors. Thus, the discussion of the preferred embodiment applies to this alternate embodiment. Referring to FIG. 8, as in the preferred embodiment, the first mirror (84) is a concave spherical mirror, the second mirror (85) is a convex spherical mirror. The third mirror (86) is substituted for the combined function of the third and fourth mirrors in the preferred embodiment. Referring now to FIG. 9, the first mirror (94), which is concave, is positioned below the second mirror (95), which is convex. The first (94) and second (95) mirrors collect the light beams and translate them into arc-shaped beams. The third mirror (96), which is flat, receives a converging beam from the second mirror and processes the beams. The condenser is then comprised of a plurality of beams with four mirrors corresponding to a single beam plus one mirror that is common to the plurality of beams. Optional, airtight valves (89) preserve vacuum in the synchrotron.

All of the optics discussed are flat mirrors or long-F/no. spherical mirrors. The plurality of arc images all have a common orientation at the curved slit of the camera. The third mirror in the set can be moved axially to focus the arc image in the camera's entrance slit. The tilt of the fifth mirror allows the arc image to be pointed into the slit. The magnification of the arc image could be changed by a small amount by playing off the individual beam image positions and the distance from the camera and the fifth mirror. The image quality realized by the present invention is adequate to illuminate any ringfield with a width of $W \geq 100$ μm. The transmission efficiency η of the complete system is equal to the product of the six mirror reflectivities in each set of mirrors. There are three mirrors that are tilted (approximately 45°) in orientation (S-polarization), two near-normal mirrors, and the fourth mirror could be set at grazing incidence (not shown in the figures). The radiation from the synchrotron is horizontally polarized, which is the "S-polarization" for all of the tilted (e.g., 45°) mirrors.

Figure 7:
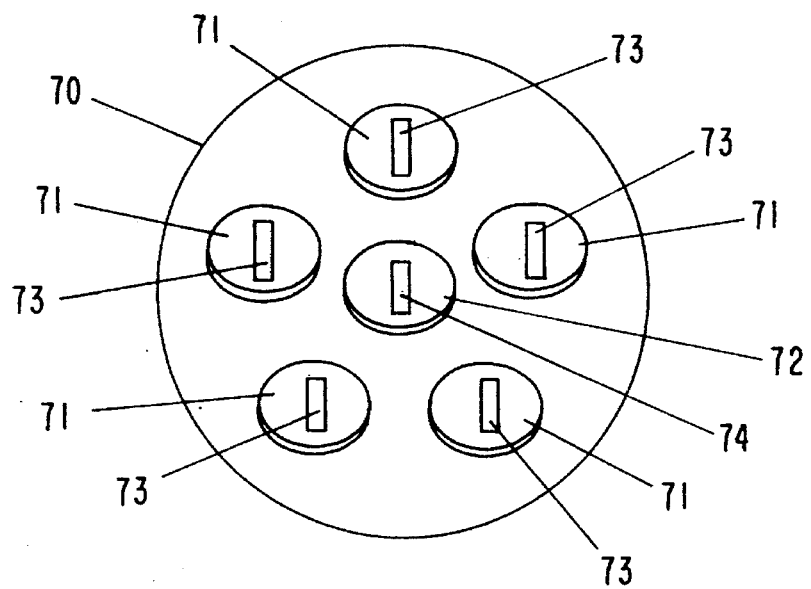
FIG. 7 is an end view of the plurality of light beams being received by flat mirrors located at the real entrance pupil of the ringfield camera.

Partial coherence in the illumination affects the image quality. For the small design features sought by the EUVL system, it is important that the condenser provide uniform, partial coherence illumination properties along the ringfield. In an incoherently illuminated optical system, small features are attenuated due to the fall-off of the modulation transfer function ("MTF"). Partial coherence can be introduced into the illumination to counter this attenuation. This is normally accomplished by underfilling the entrance pupil in a system with Kohler illumination. In other words, the source (which is usually a disk) is imaged into the entrance pupil, and this image is smaller than the pupil by a partial coherence factor of σ≈0.6. This value of σ is a reasonable compromise, which amplifies the smaller features and does not add too much "ringing" to the larger features. The partial coherence factor σ could be in the range of $0.5 > \sigma > 0.65$. The entrance pupil illumination for this embodiment is shown in FIG. 7, which shows an end view of the six light beams (73) in the same plane as that of the real entrance pupil (70) of the ringfield camera. The flat mirrors (71) and (72) serve to focus the light beams coming from the fourth mirrors into the real entrance pupil (70) of the camera. The six flat mirrors (71) and (72) are arbitrarily located, for example, 1 m in front of the real entrance pupil of the camera. Five light beams (73) are received by five flat mirrors (71) that are arranged in a symmetrical pattern about a single flat mirror (72) that receives a sixth beam (74) at the real entrance pupil (70) of the camera.

Illustrative work discussed in detail provides for collection over a full radian (~57°) of synchrotron radiation. This two-order-of-magnitude increase in collection angle increases wafer throughput or productivity. Specific needs are met by a variety of arrangements. One of the primary advances herein is the ability to illuminate a narrow ringfield of a camera by forming and focusing arc-shaped light beams into the entrance pupil of the camera, thus maximizing the collection efficiency of the condenser. Collected radiation may be reassembled in proximity printing to yield a scanning slit; or alternatively, to yield an illumination region of small aspect ratio for full-field patterning. The present invention provides for scanning (e.g., ringfield) or full-field projection.

Figure 2:
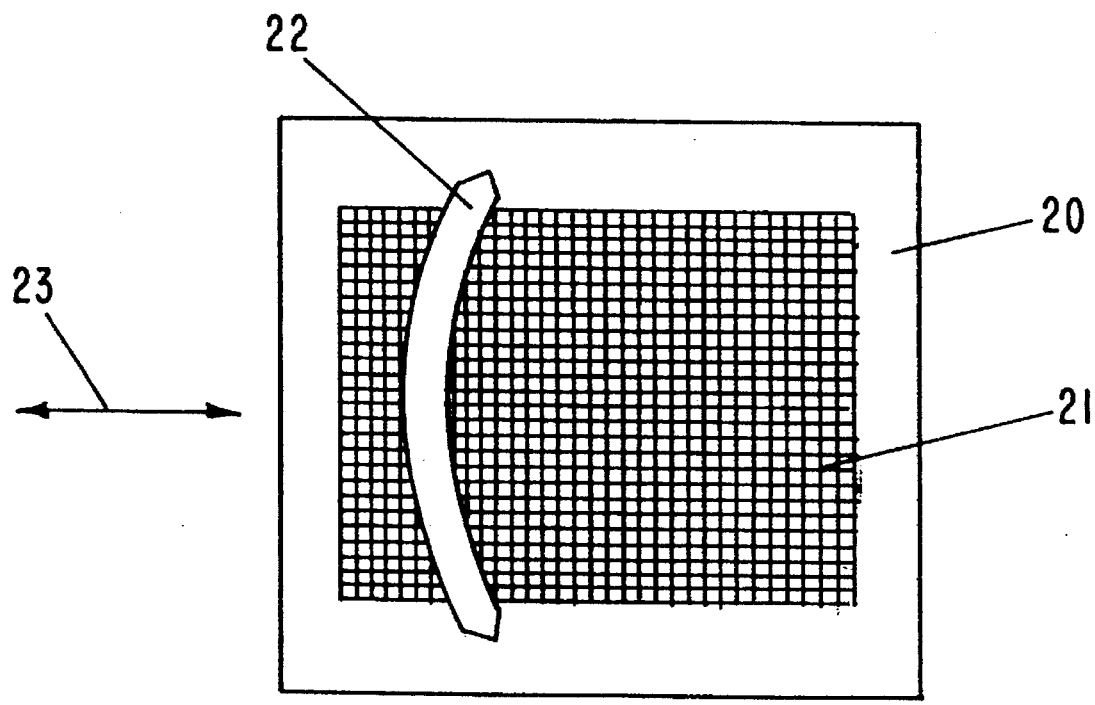
FIG. 2 is a top view of a projection mask being scanned by the arc-shaped illumination field of a ringfield camera.

The specific description that follows emphasizes ringfield projection lithography. Where fall-field exposure, either proximity printing or projection lithography, requires different optics, notation is made in the final discussion in each section. The significant case of ringfield projection lithography is represented by FIG. 2. In FIG. 2, the resistive mask (20) includes a rectilinear patterned region (21), which is being swept horizontally in direction (23) by an arc-shaped illumination region (22) which may be 1 to 8 mm wide by about 130 mm long. The energy from the condenser must illuminate only region (22) and no other part of region (21). In full-field exposure (as distinguished from the scanning shown) pattern region (22) and region (21) must be simultaneously illuminated.

1. The Collecting Optics

The collecting optics, or collector, of the condenser system are comprised of at least two spherical mirrors, a first mirror that is concave and a second mirror that is convex, positioned symmetrically about the periphery of the synchrotron source. It is expected that at least arc of collection will be 100 mrad, likely from 200 mrad to 1.5 rad. Collection over a radian for a synchrotron of radius of 1 to 2 m may require a collector length of the order of a meter. The collector length may be accommodated by using a plurality of parallel channel systems comprised of approximately 15 cm class mirrors. The distance from the collector to the synchrotron orbit is typically 1 to 3 m, but could be varied. A shorter distance may require a greater angle of incidence on the first mirror of the condenser, which would reduce the flux on the mirror. A longer distance may require collector lenses of excessive size.

The spectrum of the synchrotron emission light is broad. It is desirably tailored to meet particular needs. In projection lithography, a wavelength range of λ=120 to 140 Å takes advantage of most efficient reflectivity (of both lenses and mask). In proximity printing, a shorter wavelength in the range of λ is=8 to 16 Å is required for resolution and meets characteristics of available resists. Efficient operation of the condenser is aided by spectral narrowing, minimizing unwanted heating caused by radiation which is relatively ineffective for resist exposure. The use of multi-layer mirrors in the condenser of the present invention accomplishes the spectral narrowing. In a preferred embodiment, all of the mirrors of the condenser are multi-layer mirrors. The relatively long wavelength radiation of EUVL also permits use of glancing-angle lenses with relatively large angles of incidence. Glancing-angles lenses may inherently produce some spectral narrowing. When operating at or near the critical angle for the desired radiation wavelength, shorter wavelength radiation is not reflected.

A condenser should be able to capture several watts of radiation in the pass band of a ringfield camera and deliver over a watt to the mask, which is enough power to expose resist coated wafers at a rate of several square centimeters per second. A typical ringfield camera pass band may be 130±1.3 Å. This pass band is determined by present multilayer mirror technology. U.S. Pat. No. 5,315,629 is illustrative of a state-of-the-art ringfield projection camera. A reflectivity of 60 to 65% results from use of 40 successive Mo—Si layer pairs. Soft x-ray is also favored for surface reflection off certain metal mirrors. Angles of incidence of 5° to 10° from grazing incidence may result in reflectivity of 80 to 90%.

A plurality of pairs of spherical mirrors, a first mirror that is concave and a second mirror that is convex, are sequentially placed about the synchrotron orbit as shown in FIG. 3 to produce an illumination field. The Etendu or Lagrange Optical Invariant requires that the product of convergence angle, $\Theta$, and the corresponding focus dimension equal or exceed the same product at the mask if a dispersing element (e.g., a scatter plate) is to be avoided as in the present invention.

FIG. 3 is a top view of the optics of the complete condenser system near the synchrotron source and is illustrative in providing for a plurality of collector lenses (34) and (35), which are nominally spherical mirrors. Each mirror receives x-rays from a related spot in the orbital path of the synchrotron beam (30), and each mirror directs its reflected x-ray into focus. Synchrotron beam (30) in following curved path (31) emits a fan of radiation (32), considered as the composite of x-rays (33) produced by point sources within the arc of the synchrotron source. The fan of radiation (32) is collected by collector mirrors (34) and (35), which directs the light beams in a configuration to uniformly illuminate a ringfield of a projection lithography camera. The fan of x-rays (32) is shaped into arc-shaped beams by second mirror (35) of the collecting optics. A preferred structure for ringfield reduction projection may use six or more sets of mirrors for six light beams as shown in FIG. 3, depending upon the power to be collected from the synchrotron source. Optional, airtight valves (39) preserve vacuum in the synchrotron.

In FIG. 3, the first mirror (34) in each set (corresponding to a single beam) collects a 3.5° section of the synchrotron emission light beam with its coma-like aberration and translates it into a round spot. The first mirror (34) is nominally spherical and is tilted, for example, 9.5° in the horizontal plane. It is arbitrarily located, for example, at a distance of 3 m from the ringfield along a tangent. The ends of the collected arc of radiation are slightly defocused, making the round spot 9% larger than would be expected. This small variation is negligible because the light beam is probably smaller than 1 mm. The round spot image radiates into a solid angle described by a small vertical angle and a large horizontal angle, similar to the 3.5° section of the synchrotron emission light. The power radiated (from the spot) per unit of horizontal angle is constant, just as is the radiation exiting the synchrotron. Hence, at a distance from the spot it will form a line constant power along its length.

Figure 4:
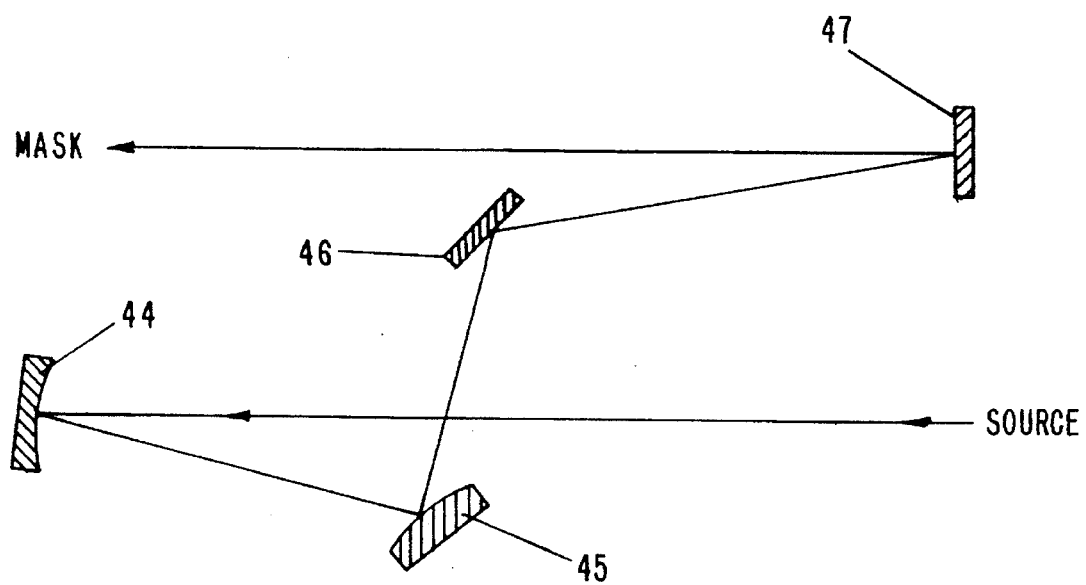
FIG. 4 is a side view of the first four mirrors of the condenser nearest the synchrotron source radiation.

The second mirror (35) translates the beam's straight line cross-section into an arc cross-section so that it will fit into the ringfield of the camera. FIG. 4 is a side view of the first four mirrors in the set of mirrors showing that second mirror (45) directs the beam upwards (e.g., angle of incidence i=48.4°); a result that is corrected by the following third mirror (46), which is flat (discussed below under The Processing Optics). Second mirror (45) is arbitrarily located, for example, at 500 mm from first mirror (44) but must be placed a few millimeters lower than the fan of radiation (32) emitted from the synchrotron. In a preferred embodiment, the second mirror (45) is designed to have a back focal distance of BFD=10 m, for this particular geometry, to enable the projection of an image of the spot into the real entrance pupil of the camera.

The focus of the collector may correspond with a real aperture of the camera, or it may itself define a virtual aperture of the camera. Adjustability of a real aperture is useful in obtaining a desired pupil fill.

2. The Processing Optics

The condenser further comprises processing optics for matching the characteristics of the ringfield camera. Characteristically, a projection reduction camera operates with a divergence of 5 to 15 mrad. Shape and size of the imaging region, again the responsibility of the processing optics, varies with the camera design.

Referring to FIG. 4, the correcting, third mirror (46) turns the beam back into the horizontal plane (e.g., i=41.6°) and almost parallel to the beam between the first mirror (44) and the second mirror (45). Thus, the third mirror (46) orients the cross-section of the beam's arc so the center is horizontal. All of the beams collected from the synchrotron are subject to the same manipulation, therefore, their arcs' cross-sections can be overlapped at the ringfield.

The fourth mirror (47) is near-normal and flat. The fourth mirror (47) directs the beams toward the fifth mirror (58) as shown in FIG. 5. The fifth mirror (58) is located at the real entrance pupil (55) of the camera (51). The fifth mirror (58) is tilted to direct the beams toward spherical mirror (59). The fourth mirror (47) of FIG. 4 turns the beam in a horizontal plane so that the image remains "horizontal." The spacing between the third mirror (46) and the fourth mirror (47) may be selected so as to "focus" the round image at the real entrance pupil. If the fourth mirror (47) could be oriented at grazing incidence, then the grazing angle would vary by at least 10°, beam to beam. Therefore, the reflectances would vary by 15 to 20%.

Figure 6:
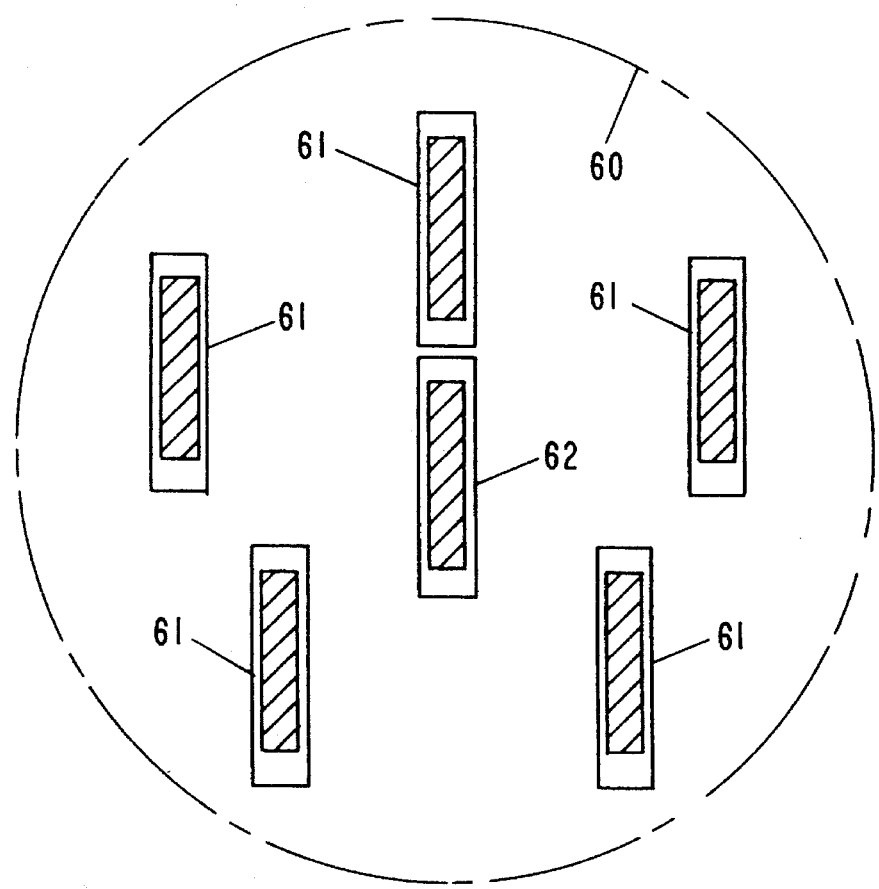
FIG. 6 is an end view of the plurality of light beams at the real entrance pupil of the ringfield camera.

In a configuration where a plurality of beams are to be processed, the fifth mirrors (58) could be arranged in a symmetrical pattern, such as the pentagonal pattern shown in FIG. 7, at the real entrance pupil of the camera. The fifth mirrors shown in FIG. 7 are arranged in a symmetrical, pentagonal pattern with five of the mirrors (71) arranged around a centrally disposed single mirror (72). Referring to FIG. 5, the fifth mirrors (58) operate to turn the beams downward (e.g., i≈55°) and point them toward the image of the mask as seen behind the sixth mirror which is located at the ringfield (52). In the horizontal plane, the centerlines of the beams emitted from the fifth mirrors all converge toward a common point at the ringfield (52) on the mask plane due to the individual tilting of the fifth mirrors. Also, the input beams to the sixth mirror are nearly horizontal. FIG. 6 illustrates an end view of one proposed beam configuration at the real entrance pupil (60) of the camera. Five of the beams (61) are arranged in a symmetrical pattern about a single beam (62). The illumination region must be directed into the virtual entrance pupil of the camera to the proper degree of fill. Fractional filling, e.g., pupil fill, optimizes contrast for a range of feature sizes.

3. The Imaging Optics

The sixth mirror (59) shown in FIG. 5, which is spherical, is common to all beam lines. It images the light beams from the real entrance pupil (54) through the resistive mask (52) and into the virtual entrance pupil of the camera (not shown). The real entrance pupil (54) is created by the fifth mirrors (58), which is an image of the actual real pupil (57) of the camera (51). The real entrance pupil is located one focal length away, so the virtual entrance pupil is projected to infinity. The distance between the sixth mirror (59) and the resistive mask is selected such that the arc image departing second mirror (45) is imaged into the ringfield of the camera. All of the arc-shaped beams collected are overlapped onto the mask by the imaging optics.

The collecting and processing optics of the condenser collects a plurality of x-ray beams that are emitted from the synchrotron source and combines them in, for example, a symmetrical, circular pattern at the real entrance pupil of a ringfield camera as shown in FIG. 7. (In the interest of clarifying the present invention, FIG. 7 depicts six light beams, but any number of light beams are possible, depending upon the power to be collected and the image quality desired.) One of the six beams could be positioned in the center with the remaining five beams symmetrically located about the centered beam. The present invention provides nearly uniform coherence properties for features on the mask oriented at any angle (angles measured in the r-Θ plane). All six light beams are received by flat mirrors positioned at the real entrance pupil and imaged through the resistive mask and into the virtual entrance pupil of the camera. The entire arc of the camera is illuminated with each of the six beams to ensure uniform illumination and coherence along the length of the arc.

With efficient design there is no clean line of separation between the collecting optics and the processing optics. The collector itself functions as processing optics to the extent that collectors are designed to direct, shape, or otherwise define the illumination region and to the extent that the collector goes beyond focusing collected radiation. The collector may increase divergence and may shape the illumination field. In most projection systems, separate processing optics is preferred, if only to avoid undue complexity in the collector design. Processing lenses may be tilted (e.g., 45°) mirrors.

In an alternative embodiment of the present invention, the substituting a single flat mirror for the third and fourth flat mirrors (described above) provided the first and second mirrors are positioned accordingly as illustrated in FIGS. 8 and 9. This embodiment accomplished the same result with less mirrors in the condenser system.

Minimal processing is required in proximity printing. FIG. 3 illustrates a condenser for use in full-field proximity printing. U.S. Pat. No. 5,315,629 is illustrative of state-of-the-art ringfield projection lithography.

It is contemplated that the system may experience temporal coherence between the six beams. If so, then the coherence could be eliminated by moving a mirror in each set of mirrors, corresponding to a single beam, perpendicular to its normal. This could be accomplished with the use of piezoelectric drivers, each oscillating at a different frequency.

a. Example 1

The particular values and configurations discussed in this Example 1 can be varied and are cited merely to illustrate a particular embodiment, and are not intended to limit the scope of the invention. In this Example 1, the condenser coupled light from a 24° sector of the synchrotron emission light into the ringfield of a 1× Offner lithography camera positioned in a vertical orientation. The condenser was configured to capture six beams of synchrotron emission light as exemplary shown in FIG. 3. The condenser system was configured to collect synchrotron emission light at a preferred wavelength of λ=134 Å. Collection of the light was made difficult due to the fact that the six beams to be collected spread out in a fan shape. Furthermore, collection was difficult because the Lagrange Optical Invariant for the 1× camera is relatively small (in comparison to, for example, a 5× camera). The ringfield width of the 1× camera is relatively narrow (again, in comparison to, for example, the ringfield width of a 5× camera ($W_{1x}$=100 μm while $W_{5x}$=1 mm)). The camera's numerical aperture was assumed to be $n.a._{1x}$=0.08, and a 1 cm length of the arc was illuminated, on a 50 mm radius. The entrance pupil of the camera had a diameter of 133 mm.

The collecting optics collected a 3.5° segment of the fan of synchrotron emission light and converted each of the six segments into six arc-shaped beams of light. The first (concave) mirror was spaced apart 3 m from the tangent of the source. It had an angle of incidence i=9.8°. The first (concave) mirrors and second (convex) mirrors were arbitrarily spaced apart by 500 mm. The second (convex) mirrors had an angle of incidence i=48°. Following each of the second mirrors in each of the six pairs, were six third (flat) mirrors and fourth (flat) mirrors comprised of six near normal flat mirrors for rotating and directing each of the six beams toward the real entrance pupil of the camera where they were received by six flat mirrors arranged in a symmetrical, circular pattern (as shown in FIG. 7). The distance between the second (convex) mirrors and the third (flat) mirrors was about 500 mm. The vertical focus was located 2 meters downstream, and the horizontal focus was located 10 meters downstream. The curved vertical "focus" was imaged into the camera's real entrance pupil. The fifth (flat) mirrors, which were ≈45° mirrors (≈17×10 mm), were located adjacent to the real entrance pupil of the camera, about 1 m away from the real entrance pupil, and were individually tilted to make all six beams substantially parallel to each other and to direct all six light beams up into the camera, which was vertically-oriented. The six beams received at the real entrance pupil of the camera each had a diameter of about 5 mm. Finally, the beams were received by a sixth, spherical (concave) mirror that imaged the arc images through the mask and into the camera's curved entrance slit.

As discussed earlier, the system's transmission efficiency η is a function of the reflectivity of the mirrors. The three near-normal mirrors had reflectivities of R≈63%. The two 45° mirrors had reflectivities of R≥67%. The condenser system also included a grazing-incidence mirror (not shown) with a reflectivity of R≈90%. The efficiency for the condenser system, therefore, is equal to the product of the six mirror reflectivities in each series of mirrors as follows: η=$(0.67)^3$*$(0.63)^2$*$(0.9)$=10.74%.

Other variations and modifications of the present invention will be apparent to those of ordinary skill in the art, and it is the intent of the appended claims that such variations and modifications be covered. For example, a one-beam system could be used to simulate the six-beam final configurations illustrated by tilting the third (flat) mirror (36) in the set of mirrors of FIG. 3 to move the beam around in the entrance pupil and by tilting one of the subsequent mirrors in the chain to compensate for the tilt introduced by the third mirror. The tilt angles would be approximately 3 mrad. Also, scan simulation would have to be performed to provide uniform illumination across the 100 μm wide entrance slit. Furthermore, the configuration could be modified to collect a 50° to 60° fan of radiation. The particular values and configurations discussed above can be varied and are cited merely to illustrate a particular embodiment of the present invention and are not intended to limit the scope of the present invention. It is contemplated that the use of the present invention may involve components having different characteristics as long as the principle, the presentation of a condenser that collects light from a synchrotron source and directs the light into the ringfield of a camera, is followed. It is intended that the scope of the present invention be defined by the claims appended hereto. The entire disclosures of all references, patents, and publications cited herein are hereby incorporated by reference.

I claim:

1. A condenser system for collecting synchrotron radiation from a synchrotron source that emits a fan of synchrotron emission light in the plane of the source and for illuminating the ringfield of a camera, comprising:

collecting means, positioned about the periphery of a synchrotron source, for collecting a plurality of synchrotron light beams emitted from the fan of synchrotron emission light and for transforming the plurality of synchrotron light beams into a plurality of arc-shaped light beams, each one of the plurality of arc-shaped light beams having an arc-shaped cross-section;

processing means, succeeding said collecting means, for rotating and directing the plurality of arc-shaped light beams toward the real entrance pupil of a camera and for positioning a plurality of substantially parallel arc-shaped light beams at the real entrance pupil of the camera; and imaging means, succeeding said processing means, for converging the substantially parallel arc-shaped light beams, for transmitting the plurality of the substantially parallel arc-shaped light beams through a resistive mask and into the virtual entrance pupil of the camera, and for illuminating the ringfield of the camera.

2. The condenser system of claim 1, wherein:

said collecting means comprises at least two spherical mirrors, wherein one of the at least two spherical mirrors is concave and one of the at least two spherical mirrors is convex;

said processing means comprises at least one correcting mirror, succeeding the at least two spherical mirrors, and a plurality of flat mirrors are positioned at a real entrance pupil of the camera and arranged in a symmetrical pattern within the real entrance pupil; and said imaging means comprises a spherical mirror that is concave.

3. The condenser system of claim 2, wherein the processing means rotates and directs the arc-shaped light beams toward the real entrance pupil of the camera in a symmetrical pattern to coincide with the symmetrical pattern of the plurality of flat mirrors.

4. The condenser system of claim 2, wherein the at least one correcting mirror is a flat mirror.

5. The condenser system of claim 2, wherein the symmetrical pattern of the light beams is arranged to produce uniform coherence properties for features on the resistive mask oriented at any angle.

6. The condenser system of claim 2, wherein the at least two spherical mirrors emit the plurality of arc-shaped light beams in a plane normal to the plane of the fan of synchrotron emission light and the correcting mirror receives the plurality of arc-shaped light beams from the at least two spherical mirrors and emits corresponding arc-shaped light beams in the plane of the fan of synchrotron emission light.

7. The condenser system of claim 2, wherein one of the at least two spherical mirrors is positioned below the plane of the fan of synchrotron emission light.

8. The condenser system of claim 2, wherein the plurality of flat mirrors emit the substantially parallel arc-shaped light beams.

9. The condenser system of claim 8, wherein the plurality of flat mirrors are individually tilted to emit the substantially parallel arc-shaped light beams.

10. The condenser system of claim 1, wherein said imaging means causes the arc-shaped light beams to be superimposed with respect to each other and formed a single arc-shaped composite beam that directly coincides with the ringfield of the camera.

11. The condenser system of claim 1, wherein the arc-shaped light beams received by the imaging means are substantially coplanar with respect to the plane of the fan of synchrotron emission light.

12. The condenser system of claim 1, wherein the imaging means is configured to image a ringfield with a width of $W \geq 100$ μm.

13. The condenser system of claim 1, wherein said collecting means collects synchrotron emission light over an arc of at least 100 mrad.

14. The condenser system of claim 1, wherein said collecting means collects synchrotron emission light over an arc of at least 200 mrad.

15. The condenser system of claim 1, wherein said collecting means, said processing means, and said imaging means comprise a plurality of multi-layer mirrors.

16. The condenser system of claim 1, wherein said collecting means collect synchrotron emission light in the wavelength range of $\lambda = 50$ to 700 Å.

17. The condenser system of claim 1, wherein said collecting means collect synchrotron emission light at the wavelength of $\lambda = 134$ Å.

* * * * *